(12) United States Patent
Jeon et al.

(10) Patent No.: US 9,142,701 B2
(45) Date of Patent: *Sep. 22, 2015

(54) TANDEM TYPE INTEGRATED PHOTOVOLTAIC MODULE AND MANUFACTURING METHOD THEREOF

(75) Inventors: La-Sun Jeon, Seoul (KR); Seung-Yeop Myong, Seoul (KR)

(73) Assignee: Intellectual Discovery Co., Ltd., Seoul (KR)

( * ) Notice: Subject to any disclaimer, the term of this patent is extended or adjusted under 35 U.S.C. 154(b) by 309 days.

This patent is subject to a terminal disclaimer.

(21) Appl. No.: 13/483,870

(22) Filed: May 30, 2012

(65) Prior Publication Data

US 2013/0206216 A1 Aug. 15, 2013

(30) Foreign Application Priority Data

Nov. 24, 2011 (KR) .......................... 10-2011-0123496

(51) Int. Cl.
| | |
|---|---|
| *H01L 31/042* | (2014.01) |
| *H01L 31/00* | (2006.01) |
| *H01L 31/0687* | (2012.01) |
| *H01L 31/0465* | (2014.01) |

(52) U.S. Cl.
CPC ........ *H01L 31/0687* (2013.01); *H01L 31/0465* (2014.12); *Y02E 10/544* (2013.01)

(58) Field of Classification Search
USPC .................................. 136/244, 246, 252, 256
See application file for complete search history.

(56) References Cited

U.S. PATENT DOCUMENTS

| | | | |
|---|---|---|---|
| 6,265,652 B1 * | 7/2001 | Kurata et al. ................. | 136/244 |
| 2009/0065060 A1* | 3/2009 | Yonezawa et al. ............ | 136/265 |
| 2010/0147361 A1* | 6/2010 | Chen ............................. | 136/249 |
| 2010/0180925 A1 | 7/2010 | Nasuno et al. | |
| 2011/0041889 A1* | 2/2011 | Murata ......................... | 136/244 |

FOREIGN PATENT DOCUMENTS

| | | | | |
|---|---|---|---|---|
| JP | 11-186573 | 7/1999 | | |
| JP | 2002-94089 | 3/2002 | | |
| JP | 2002261308 | * 9/2002 | ................... | 136/256 |
| JP | 2009-49227 | 3/2009 | | |

(Continued)

OTHER PUBLICATIONS

Notice of Allowance issued on Mar. 27, 2015, in U.S. Appl. No. 13/477,623.
Non-Final Office Action issued on Sep. 26, 2014, in U.S. Appl. No. 13/477,623.

(Continued)

*Primary Examiner* — Jeffrey T Barton
*Assistant Examiner* — Uyen Tran
(74) *Attorney, Agent, or Firm* — H.C. Park & Associates, PLC

(57) ABSTRACT

Disclosed is a tandem type integrated photovoltaic module. The tandem type integrated photovoltaic module includes: a first cell and a second cell, all of which are formed respectively by stacking on a substrate a lower electrode, a photoelectric conversion layer including a plurality of unit cell layers, and an upper electrode, wherein the lower electrode of the first cell and the lower electrode of the second cell are separated by a lower electrode separation groove, and wherein a plurality of through holes are formed to be spaced from each other in the photoelectric conversion layer of the second cell in order to connect the upper electrode of the first cell with the lower electrode of the second cell.

18 Claims, 10 Drawing Sheets

(56) References Cited

FOREIGN PATENT DOCUMENTS

| | | |
|---|---|---|
| JP | 2011-155041 | 8/2011 |
| KR | 10-2009-0080171 | 7/2009 |

OTHER PUBLICATIONS

Final Office Action issued on Feb. 27, 2015, in U.S Appl. No. 13/477,623.

\* cited by examiner

TANDEM TYPE INTEGRATED PHOTOVOLTAIC MODULE AND MANUFACTURING METHOD THEREOF

CROSS-REFERENCE TO RELATED APPLICATIONS

This application claims the benefit of Korean Patent Application No. 10-2011-0123496 filed on Nov. 24, 2011, which is hereby incorporated by reference.

FIELD OF THE INVENTION

The present invention relates to a tandem type integrated photovoltaic module and a manufacturing method thereof.

BACKGROUND OF THE INVENTION

Recently, as existing energy resources like oil and coal and the like are expected to be exhausted, much attention is increasingly paid to alternative energy sources which can be used in place of the existing energy sources. As an alternative energy sources, sunlight energy is abundant and has no environmental pollution. Therefore, more and more attention is paid to the sunlight energy.

A photovoltaic module converting sunlight energy into electrical energy has a junction structure of a p-type semiconductor and an n-type semiconductor. When light is incident on the photovoltaic module, an electron with a negative electric charge and a -hole with a positive electric charge are generated by interaction between the light and a material constituting the semiconductor of the photovoltaic module. Then, electric current flows while the electron and the hole move.

Depending on the thickness of the semiconductor of the photovoltaic module, the photovoltaic module is classified into a bulk type photovoltaic module and a thin-film type photovoltaic module. The thin-film type photovoltaic module includes a photovoltaic material layer of which the thickness is equal to or less than from several tens of micrometers to several micrometers.

At present, a bulk type silicon photovoltaic module is mainly and widely used for ground power. However, the recent increase of the demand for the bulk type silicon photovoltaic module is now increasing its price due to the lack of its raw material.

Therefore, in recent times, providing an integrated thin-film photovoltaic module has become the most important issue, which has high energy conversion efficiency and can be mass produced at a low cost. However, a single-junction thin-film photovoltaic module is limited in its achievable performance. Accordingly, a double junction thin-film photovoltaic module or a triple junction thin-film photovoltaic module having a plurality of stacked unit cells has been developed, pursuing high stabilized efficiency. The double junction thin-film photovoltaic module and the triple junction thin-film photovoltaic module are called a tandem type photovoltaic module.

In addition to this, researches are now being devoted to an integration technology for the photovoltaic module in order to improve the efficiency of the thin-film photovoltaic module.

The integration technology for the photovoltaic module is to improve the photovoltaic conversion efficiency by reducing the interfacial resistance of a large area photovoltaic module. Up to the present day, the integration technology is performed by a conventional straight line type laser scribing. Since the conventional straight line type laser scribing is performed transversely to the movement direction of the electron, the moving distance of the electron becomes shorter, and then collection efficiency can be improved. However, a photovoltaic cell cannot generate photoelectron-motive force in a laser scribed portion. Therefore, an ineffective area of a solar cell is generated.

FIG. 1 is a perspective view of a thin-film photovoltaic module manufactured by a conventional straight line type laser scribing.

A lower electrode 200, a photoelectric conversion layer 300 and an upper electrode 400 are sequentially formed on a substrate 100. A lower electrode separation groove $P_1$ penetrating through the lower electrode 200 is formed to prevent a short-circuit of the lower electrodes 200. A separation groove $P_2$ is formed to penetrate through the photoelectric conversion layer 300. An upper separation groove $P_3$ is formed to penetrate through the photoelectric conversion layer 300 and the upper electrode 400. Unit cells $UC_1$ and $UC_2$ are formed by the upper separation groove $P_3$.

Here, the photoelectric conversion layer 300 may have a structure formed by stacking a plurality of unit cell layers. The unit cell layer is a basic unit layer capable of performing photoelectric conversion. For example, the photoelectric conversion layer 300 may include two stacked unit cell layers or three stacked unit cell layers. That is, each of the unit cells $UC_1$ and $UC_2$ may have a structure formed by stacking a plurality of the unit cell layers. The photoelectric conversion layer 300 may include a silicon alloy intermediate reflector such as silicon oxide, silicon nitride and silicon carbide in order to maximize light trapping effect by enhancing internal reflection.

Adjacent unit cells $UC_1$ and $UC_2$ are connected in series to each other by the separation groove $P_2$ connecting the upper electrode 400 with the lower electrode 200 and functioning as a path of the electron. In other words, the lower electrode 200 of a first unit cell $UC_1$ is connected to the upper electrode 400 of a second unit cell $UC_2$ by the separation groove $P_2$, so that the first unit cell $UC_1$ is connected in series to the second unit cell $UC_2$. All of the adjacent unit cells can be connected in series to each other.

As shown in FIG. 1, the lower electrode separation groove $P_1$, the separation groove $P_2$ and the upper separation groove $P_3$ are formed respectively by a laser scribing which follows straight lines 210, 310 and 410.

Here, portions formed through the extension of the lower electrode separation groove $P_1$, the separation groove $P_2$ and the upper separation groove $P_3$ correspond to ineffective areas incapable of performing energy conversion. In general, a gap between the lower electrode separation groove $P_1$ and the upper separation groove $P_3$ is from about 200 μm to about 300 μm.

The ineffective area is generated by the laser scribing in every gap between the unit photovoltaic cells connected in series to each other.

In the photovoltaic module, when a remaining area which is obtained by removing semiconductor and conductor for the purpose of edge isolation and performs the photoelectric conversion is referred to as an effective area, a ratio of the ineffective area by the laser scribing for series connection to the effective area is from about 2.5% to about 5.0%.

Accordingly, for the purpose of manufacturing the thin-film photovoltaic module having high efficiency, an integrated thin-film photovoltaic module and a manufacturing method thereof are required, which is able to improve photovoltaic conversion efficiency of the module by reducing the ineffective area through the minimization of a portion on which the laser scribing is performed. Further, in order to obtain high energy conversion efficiency, an integration technology is needed to be applied to the tandem type photovoltaic module.

SUMMARY OF THE INVENTION

One aspect of the present invention is a tandem type integrated photovoltaic module. The tandem type integrated photovoltaic module includes: a first cell and a second cell, all of which are formed respectively by stacking on a substrate a lower electrode, a photoelectric conversion layer including a plurality of unit cell layers, and an upper electrode, wherein the lower electrode of the first cell and the lower electrode of the second cell are separated by a lower electrode separation groove, and wherein a plurality of through holes are formed to be spaced from each other in the photoelectric conversion layer of the second cell in order to connect the upper electrode of the first cell with the lower electrode of the second cell.

Another aspect of the present invention is a manufacturing method of a tandem type integrated photovoltaic module. The method includes: forming a lower electrode layer on a substrate; forming a lower electrode separation groove separating the lower electrode layer into a first cell lower electrode layer and a second cell lower electrode layer; forming a photoelectric conversion layer including a plurality of unit cell layers on the first cell lower electrode layer and a second cell lower electrode layer; forming a plurality of through holes which are spaced from each other and penetrate through the photoelectric conversion layer on the second cell lower electrode layer; forming an upper electrode layer within the through hole and on the photoelectric conversion layer; and forming an upper separation groove separating the upper electrode layer and the photoelectric conversion layer, wherein a portion of the upper separation groove passes over the lower electrode separation groove.

Further another aspect of the present invention is a tandem type integrated photovoltaic module further including a transparent electrode layer on the photoelectric conversion layer.

Further another aspect of the present invention is a tandem type integrated photovoltaic module further including a high resistance layer formed on a side surface of the through hole.

Further another aspect of the present invention is a manufacturing method of a tandem type integrated photovoltaic module. The manufacturing method may further include forming a transparent electrode layer on the photoelectric conversion layer.

Yet another aspect of the present invention is a manufacturing method of a tandem type integrated photovoltaic module. The manufacturing method may further include forming a high resistance layer formed on a side surface of the through hole.

DETAILED DESCRIPTION OF THE INVENTION

Figure 1:
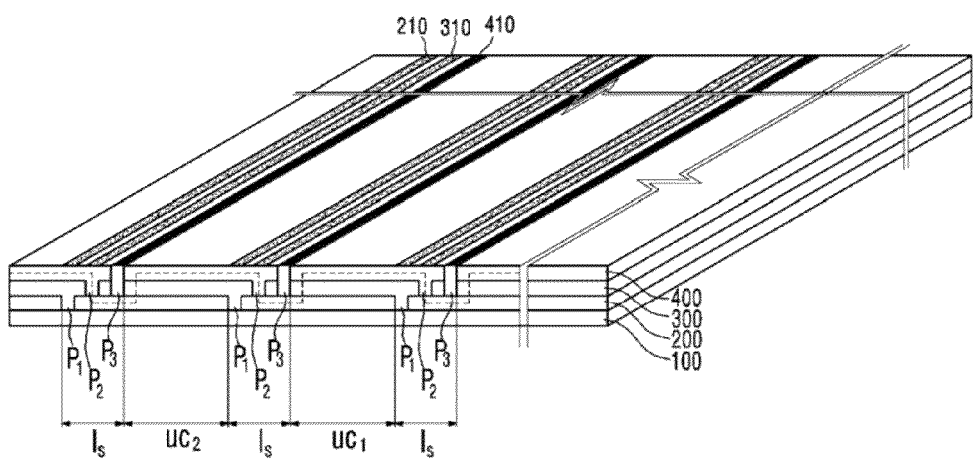
FIG. 1 is a perspective view showing a thin-film photovoltaic module manufactured by a conventional straight line type laser scribing.

Hereafter, an exemplary embodiment of the present invention will be described in detail with reference to the accompanying drawings. Here, the embodiment of the present invention can be variously transformed, and the scope of the present invention is not limited to the following embodiment. The shapes and sizes of the components in the drawings may be exaggerated for clarity of the description. It is noted that the same reference numerals are used to denote the same elements throughout the drawings. In the following description of the present invention, the detailed description of known functions and configurations incorporated herein is omitted when it may make the subject matter of the present invention unclear.

Figure 2:
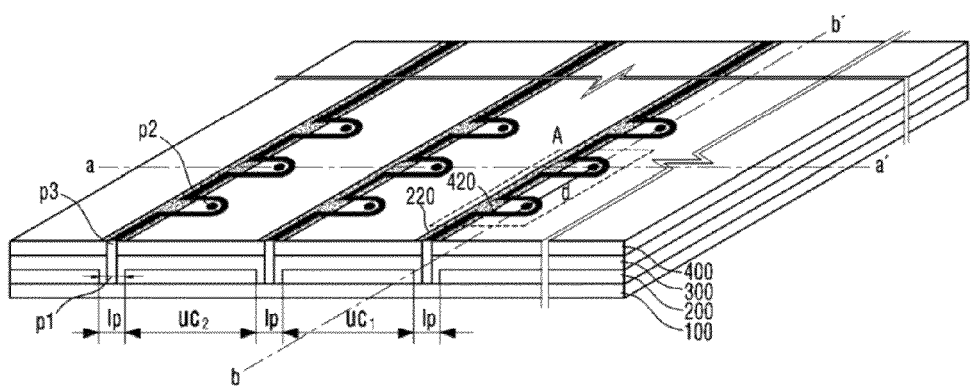
FIG. 2 is a perspective view showing a photovoltaic module including photovoltaic cells which are connected in series through a point contact in accordance with an embodiment of the present invention.

FIG. 2 is a perspective view showing a photovoltaic module including photovoltaic cells which are connected in series through a point contact in accordance with an embodiment of the present invention. Here, the shapes of a lower electrode separation groove $P_1$, a through hole $P_2$ and an upper separation groove $P_3$ are shown on the upper surface of the photovoltaic module in FIG. 1 and the following figures for convenience of description. The shapes may not be observed on the upper surface.

The photovoltaic module according to the embodiment of the present invention includes a substrate 100, a lower electrode 200, a photoelectric conversion layer 300 and an upper electrode 400. A photovoltaic module according to another embodiment of the present invention may further include a transparent conductive layer between the photoelectric conversion layer 300 and an upper electrode 400.

Here, the photoelectric conversion layer 300 may include a plurality of unit cell layers 310 and 330. For example, the photoelectric conversion layer 300 may include two stacked unit cell layers or three stacked unit cell layers. Each of the stacked unit cell layers is a basic unit layer capable of performing photoelectric conversion. A tunnel junction is formed between the plurality of unit cell layers 310 and 330.

For example, the photoelectric conversion layer 300 may include a first unit cell layer 310 and a second unit cell layer 330. Each of the first and second unit cell layers 310 and 330 comprises a p-type semiconductor layer and n-type semiconductor layer. Here, the p-type semiconductor layer of the first unit cell layer 310 and the n-type semiconductor layer of the second unit cell layer 330 are adjacent with each other and may form a p-n tunnel junction, or the n-type semiconductor layer of the first unit cell layer 310 and the p-type semiconductor layer of the second unit cell layer 330 are adjacent with each other and may form a p-n tunnel junction. When the p-n tunnel junction is formed, the electrical resistance at the p-n tunnel junction portion becomes significantly low and thus the electrical conductance thereof becomes high.

An intermediate reflector may be inserted between the stacked unit cell layers in order to maximize light trapping effect by enhancing internal reflection. For example, when the photoelectric conversion layer 300 includes two unit cell layers, the intermediate reflector can be inserted between the two unit cell layers. The intermediate reflector may include a silicon alloy such as silicon oxide, silicon nitride and silicon carbide and the like. Also, the intermediate reflector may include a transparent material such as zinc oxide (ZnO), silicon monoxide (SiO), tin dioxide ($SnO_2$) and the like.

When the photoelectric conversion layer 300 includes a plurality of the unit cell layers, each of the unit cells $UC_1$ and $UC_2$ may have a structure formed by stacking a plurality of the unit cell layers. The open circuit voltage of each of the unit cells $UC_1$ and $UC_2$ is the sum of the open circuit voltages of the stacked unit cell layers. The short-circuit current of each of the unit cells $UC_1$ and $UC_2$ is a minimum value among the short-circuit currents of the stacked unit cell layers.

As shown in FIG. 2, a lower electrode separation groove $P_1$ is formed to penetrate through the lower electrode 200 so as to prevent the short circuit between the lower electrodes 200. The lower electrode separation groove $P_1$ may be, for example, formed along a straight first line 220.

A plurality of through-holes $P_2$ penetrating the photoelectric conversion layer 300 are spaced from each other in the form of a point having a predetermined width instead of a straight line and formed on one side of the lower electrode separation groove $P_1$. According to another embodiment of the present invention, the through hole $P_2$ may be formed to penetrate through the photoelectric conversion layer 300 and the transparent conductive layer. Adjacent unit cells $UC_1$ and $UC_2$ are connected in series to each other by the through hole $P_2$. That is, the upper electrode 400 of a first unit cell $UC_1$ is connected to the lower electrode 200 of a second unit cell $UC_2$ by the point type through hole $P_2$, so that the first unit cell $UC_1$ and the second unit cell $UC_2$ can be connected in series to each other. While it is described in this specification that the through hole $P_2$ is formed in the form of a point, this is just an example. As long as the plurality of the through holes $P_2$ are spaced from each other, the through hole $P_2$ may have a cut and divided straight line shape extending in one direction.

Figure 3A:
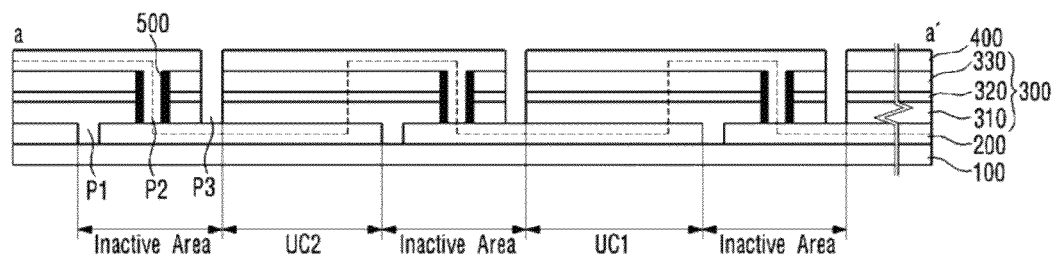
FIGS. 3a and 3b are cross sectional views taken along lines a-a' and b-b' of FIG. 2.

FIG. 3a shows a cross sectional view taken along line a-a' of the photovoltaic module of FIG. 2. As shown in FIG. 3a, it can be seen that a portion in which the through hole $P_2$ has been formed is the same as the section of the prior art photovoltaic module of FIG. 1. Though the through hole $P_2$ is not formed along the straight line, the unit cells $UC_1$ and $UC_2$ can be still connected in series to each other through the portions in which the through holes $P_2$ have been formed separately from each other.

According to the embodiment of the present invention, though the p-n tunnel junction having high electrical conductance is formed between the plurality of the unit cell layers, the current leakage due to the contact between the p-n tunnel junction portion and the upper electrode 400 filled in the through hole P2 can be prevented from being generated. Also, even in the case that the intermediate reflector 320 comprises conductive material, the current leakage due to the contact between the upper electrode 400 and the intermediate reflector 320 can be prevented from being generated. This can be obtained by forming a high resistance layer on a side surface of the through hole P2 as shown in FIG. 3a. Thus, the upper electrode 400 filled in the through hole P2 is electrically insulated from the p-n tunnel junction portion and/or the intermediated reflector 320, and the current leakage can be prevented from being generated. As a result, it is prevented that the fill factor of the photovoltaic module is decreased due to the current leakage. While it is shown in FIG. 3a that the high-resistance layer is formed on the entire side surface of the through hole P2, the high resistance layer may be formed on the portion of the side surface exposing the p-n tunnel junction portion and/or the intermediate reflector comprising the conductive material.

An upper separation groove $P_3$ is formed to penetrate through the photoelectric conversion layer 300 and the upper electrode 400, and then the unit cells $UC_1$ and $UC_2$ are hereby formed. With the exception of a portion where the upper separation groove $P_3$ surrounds the point type through hole $P_2$ in a predetermined shape, the upper separation groove $P_3$ is formed on the lower electrode separation groove $P_1$. For example, the upper separation groove $P_3$ may be formed along a second line 420.

Here, a ratio of an overlapped length of the upper separation groove $P_3$ and the lower electrode separation groove $P_1$ to the length of the lower separation groove $P_1$ may be equal to or greater than 0.70 and equal to and less than 0.96. When the ratio is less than 0.70, the ineffective area is increased, so that electric current cannot sufficiently rise and manufacturing time may be increased. When the ratio is greater than 0.96, the path of the electron is increased, so that an electrical resistance and Joule heat are increased, and then fill factor of the photovoltaic module may be reduced.

Figure 3B:
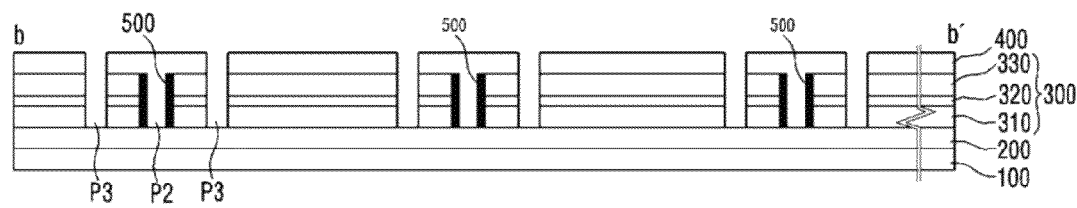

For the purpose of understanding the present invention, FIG. 3b shows a cross sectional view taken along line b-b' of the photovoltaic module of FIG. 2. As shown in FIG. 2, a portion of the upper separation groove $P_3$, which is formed on the lower electrode separation groove $P_1$, extends up to the upper surface of the substrate 100. On the other hand, as shown in FIG. 3b, a portion of the upper separation groove $P_3$, which does not pass over the lower electrode separation groove $P_1$, extends only up to the upper surface of the lower electrode 200. This is because while the upper separation groove $P_3$ is formed to penetrate through the photoelectric conversion layer 300 and the upper electrode 400, the lower electrode 200 of the forming portion of the lower electrode separation groove $P_1$ has been already removed by the lower electrode separation groove $P_1$.

As described above, since the first line 220 in which the lower electrode separation groove $P_1$ is formed and the second line 420 in which the upper separation groove $P_3$ is formed are overlapped with each other with the exception of a particular area, the ineffective area of the photovoltaic module according to the embodiment of the present invention is reduced. Also, since the through hole $P_2$ for connecting in series the unit cells within the photovoltaic module is formed separately from each other at a predetermined interval in the form of the point contact, the ineffective area of the photovoltaic module can be reduced. Therefore, the effective area compared to the same area is increased, so that a relative current value is increased.

Hereafter, a manufacturing process of a photovoltaic module including the photovoltaic cells connected in series to each other by the point contact in accordance with the embodiment of the present invention will be described in detail with reference to FIGS. 4a to 4g. Although FIGS. 4a to 4g show three unit cells, the photovoltaic module of the present invention may include a larger number of the unit cells.

Figure 4A:
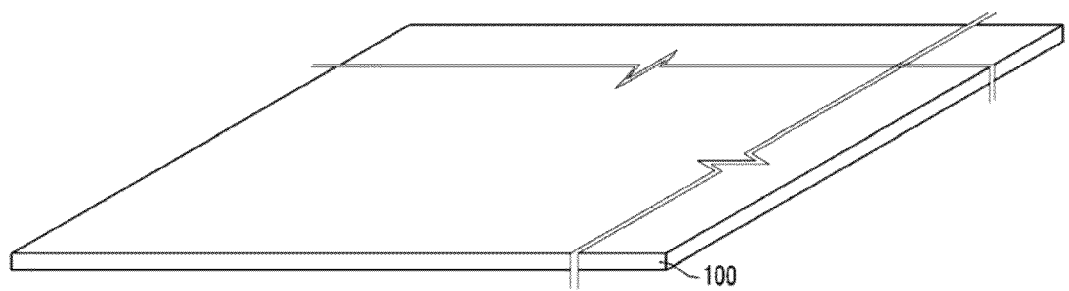
FIGS. 4a to 4g show a manufacturing process of a tandem type integrated photovoltaic module according to the embodiment of the present invention.

As shown in FIG. 4a, the substrate 100 is provided. The substrate 100 may be an insulating transparent substrate. When the photovoltaic module according to the embodiment of the present invention performs photoelectric conversion by light irradiated from the upper electrode 400, the substrate 100 may be an insulating opaque substrate. The substrate 100 may be a flexible substrate.

Figure 4B:
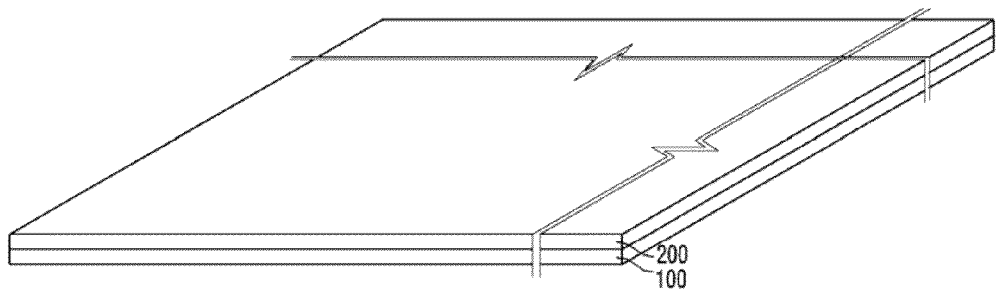

As shown in FIG. 4b, the lower electrode 200 is formed on the substrate 100. The lower electrode 200 may be a transparent conductive electrode including $SnO_2$, ZnO and ITO and the like. When the photovoltaic module according to the embodiment of the present invention performs photoelectric conversion by light irradiated from the upper electrode 400, the lower electrode 200 may be an opaque electrode.

Figure 4C:
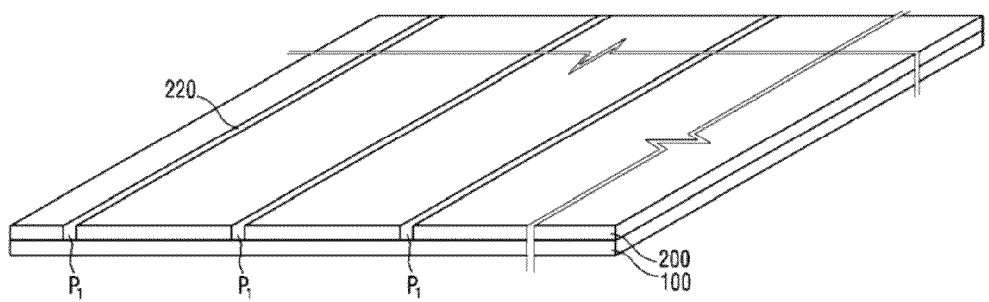

As shown in FIG. 4c, the lower electrode 200 is scribed by irradiating laser from the air to the lower electrode 200 or the substrate 100. The lower electrode separation groove $P_1$ penetrating through and separating the lower electrode 200 is hereby formed, for example, along the straight first line 220. That is, the lower electrode 200 is separated by the lower electrode separation groove $P_1$, thereby preventing the short-circuit between the adjacent lower electrodes 200.

Figure 4D:
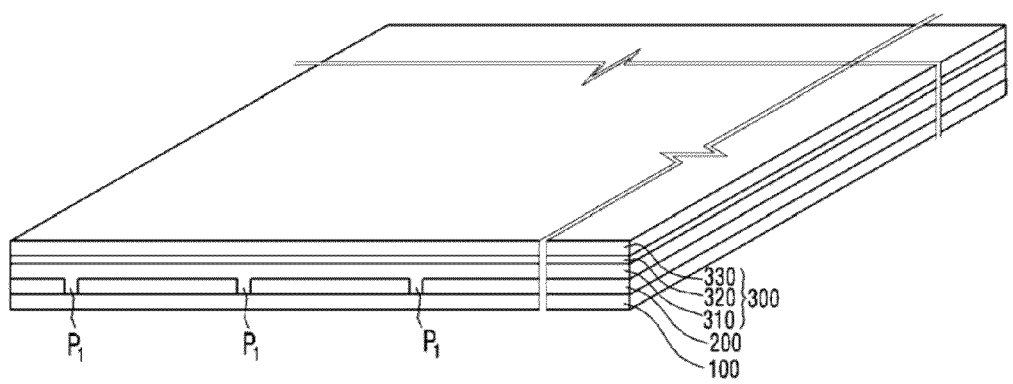

As shown in FIG. 4d, the photoelectric conversion layer 300 is formed on the lower electrode 200. Here, the photoelectric conversion layer 300 can be also formed on the lower electrode separation groove $P_1$. For example, the photoelectric conversion layer 300 including a plurality of unit cell layers 310 and 330 can be formed on the lower electrode 200. Hereafter, though the photoelectric conversion layer 300 including two unit cell layers will be described below, three or more unit cell layers may be included in the photoelectric conversion layer 300 in accordance with the embodiment of the present invention. Also, an intermediate reflector 320 may be included between the unit cell layers in accordance with the embodiment of the present invention.

The first and the second unit cell layers 310 and 330 may include any material converting incident light energy into electrical energy. For example, the first and the second unit cell layers 310 and 330 include a photovoltaic material capable of forming a thin-film type photovoltaic module such as an amorphous silicon solar cell, a compound solar cell, an organic solar cell and a dye sensitized solar cell.

The intermediate reflector reflects a part of light which has transmitted through a unit cell layer on which the light is first incident among the first unit cell layer and the second unit cell layer, to the unit cell layer on which light is first incident, and passes a part of the light through the other unit cell layer. As a result, the amount of the light absorbed by the unit cell layer on which the light is first incident is increased, so that electric current generated from the unit cell layer can be increased.

Here, among the first and the second unit cell layers, the optical band gap of one unit cell layer closer to a light incident side than the other may be larger than that of the other unit cell layer. For example, when light is incident through the substrate 100, the optical band gap of the first unit cell layer is larger than that of the second unit cell layer. This is because light with a short wavelength having a high energy density has a short light transmission distance, and a material having a larger optical band gap absorbs more light with a short wavelength.

The photoelectric conversion layer 300 in the present specification may include the unit cell layers and the intermediate reflector inserted between the unit cell layers in accordance with the embodiment. The unit cell layers of the photoelectric conversion layer 300 are commonly formed in vacuum. Laser patterning for forming the lower electrode separation groove $P_1$, the through hole $P_2$ and the upper separation groove $P_3$ is performed in atmospheric air. Therefore, with regard to FIG. 4e, the photoelectric conversion layer 300 should be exposed to the atmosphere so as to perform laser scribing for forming the through hole $P_2$ to be described below. Here, for a time during which the photoelectric conversion layer 300 is exposed to the atmosphere, the photoelectric conversion layer 300 is oxidized and may be deteriorated. Consequently, the efficiency of the manufactured photovoltaic module may be degraded.

Accordingly, in the manufacture of the photovoltaic module according to another embodiment of the present invention, after the forming of the photoelectric conversion layer 300 in vacuum and before the forming of the through hole $P_2$ in atmospheric air, a forming of the transparent conductive layer on the photoelectric conversion layer 300 in vacuum can be further included. As such, it is possible to prevent the photoelectric conversion layer 300 from being deteriorated by being exposed to the atmosphere. For example, since the transparent conductive layer is formed on the photoelectric conversion layer 300, the photoelectric conversion layer 300 can be prevented from being oxidized during the process of the laser scribing in the atmosphere.

The transparent conductive layer cannot only, as described above, protect the photoelectric conversion layer 300 but also maximize light trapping effect between the photoelectric conversion layer 300 and the upper electrode 400. In other words, the transparent conductive layer reflects light which is not used in the photovoltaic conversion in the photoelectric conversion layer 300 and causes the light to be reused in the photoelectric conversion layer 300, thereby improving the light efficiency. The transparent conductive layer may include, for example, ZnO or ITO.

Hereafter, although it is described that the through hole $P_2$ penetrates through only the photoelectric conversion layer 300, the through hole $P_2$ may be formed to penetrate through the photoelectric conversion layer 300 and the transparent conductive layer formed on the photoelectric conversion layer 300 in accordance with embodiments. Further, although it is described that the upper separation groove $P_3$ penetrates through the photoelectric conversion layer 300 and the upper electrode 400, the upper separation groove $P_3$ may be formed to penetrate through the photoelectric conversion layer 300, the transparent conductive layer and the upper electrode 400 in accordance with embodiments.

Figure 4E:
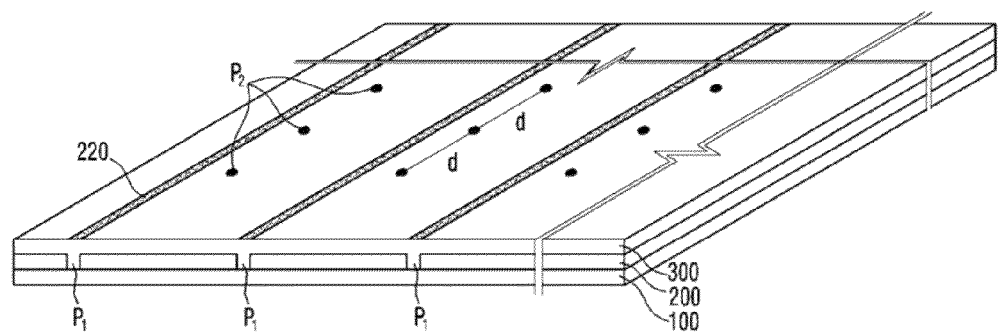

As shown in FIG. 4e, laser is irradiated in the atmosphere to the substrate 100 or the photoelectric conversion layer 300, so that the photoelectric conversion layer 300 is scribed. As a result, a plurality of the through holes $P_2$ are formed to penetrate through the photoelectric conversion layer 300. The through hole $P_2$ is not formed along the straight line unlike a conventional technology. The plurality of the through holes $P_2$ are spaced from each other in the form of a point having a predetermined width and formed on one side of the lower electrode separation groove $P_1$. Through the through holes $P_2$ formed in such a manner, the unit cells within the photovoltaic module are connected in series to each other.

Next, the high resistance layer 500 is formed on the side surface of the through hole P2 as shown in FIGS. 3a and 3b. The high resistance layer 500 may be formed only on the portion of the side surface exposing the p-n tunnel junction portion. Also, the high resistance layer 500 may be formed on the portion of the side surface exposing the p-n tunnel junction portion and the intermediate reflector 320. The reason for forming the high resistance layer 500 is to prevent the current leakage from the contact between the upper electrode 400 and the conducting material of the intermediate reflector 320 from being generated. For example, each of the first and second unit cell layers 310 and 330 comprises a p-type semiconductor layer and n-type semiconductor layer. Here, the n-type semiconductor layer of the first unit cell layer 310 and the p-type semiconductor layer of the second unit cell layer 330 are adjacent with each other and may form a p-n tunnel junction, or the p-type semiconductor layer of the first unit cell layer 310 and the n-ape semiconductor layer of the second unit cell layer 330 are adjacent with each other and may form a p-n tunnel junction.

When the p-n tunnel junction is formed, the high resistance layer 500 may be formed on the side surface where the p-n tunnel junction portion is exposed by the through hole P2. When the intermediate reflector 320 is included between the first unit cell layer 310 and second unit cell layer 330, the high resistance layer 500 may be formed on the side surface where the p-n tunnel junction portion and the intermediate reflector 320 are exposed by the through hole P2.

The reason for forming the high resistance layer 500 is that there is a possibility for the current leakage to be generated when the upper electrode 400 is in contact with the intermediate reflector 320 and/or the p-n tunnel junction portion through the through hole P2. The generation of the current leakage can be prevented by forming the high resistance layer 500 on the side surface where the intermediate reflector 320 and/or the p-n tunnel junction portion are exposed by the through hole 2.

The high resistance layer 500 may be formed on the side surface of the through hole P2 through plasma treatment. A high resistance element for forming the high resistance layer 500 may be chosen from oxygen (O), nitrogen (N), carbon (C) and the like. Here, through the plasma treatment in the gas atmosphere comprising the high resistance element, the high resistance layer 500 may be formed on the side surface of the through hole P2.

Also, the high resistance layer 500 may be formed through oxidizing the side surface of the through hole P2 by a chemical method using chemicals or a physical method such as an ion/electron beam irradiation.

The contact between the upper electrode 400 and the p-n tunnel junction portion and/or the intermediate reflector 320 is prevented, and thus generation of the current leakage can be avoided. In addition, the internal reflection can be increased by forming the high resistance layer 500 on the side surface of the through hole P2 since the high resistance element such as oxygen (O), nitrogen (N) and carbon (C) contributes to reducing a refractive index. This may lead to increase of current generated from the photovoltaic module by improving the light usage efficiency thereof.

Figure 4F:
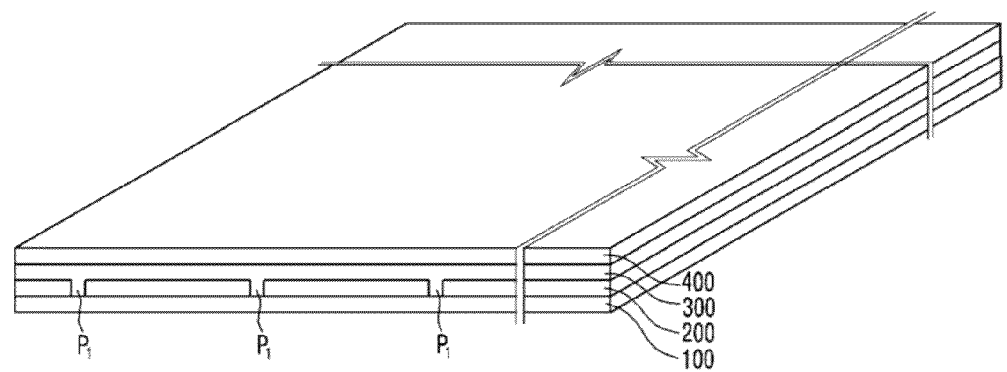

As shown in FIG. 4f, the upper electrode 400 is formed to cover the photoelectric conversion layer 300 and the through hole $P_2$. The upper electrode 400 may include a conductive material which well reflects light and functions as an electrode. For example, the conductive material constituting the upper electrode 400 may include Al, Ag, Au, Cu, Zn, Ni, Pt, Pd and Cr and the like. In addition, when the photovoltaic module according to the embodiment of the present invention performs photoelectric conversion by the light irradiated from the upper electrode 400, the upper electrode 400 can be formed of a transparent conductive material. In this case, the lower electrode 200 may include a conductive material which well reflects light and functions as an electrode.

Figure 4G:
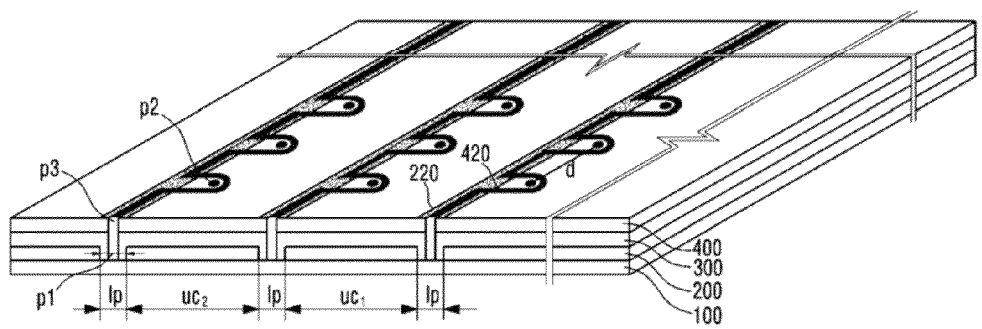

As shown in FIG. 4g, laser is irradiated from the atmosphere, and then the photoelectric conversion layer 300 and the upper electrode 400 are scribed. As a result, the upper separation groove $P_3$ penetrating through the photoelectric conversion layer 300 and the upper electrode 400 is formed along the second line 420. With the exception of a portion of the second line 420, which surrounds the point type through hole $P_2$, the second line 420 follows the same path as the first line 220. That is, with the exception of a portion of the upper separation groove $P_3$, which surrounds the through hole $P_2$, the upper separation groove $P_3$ is formed to pass over the lower electrode separation groove $P_1$. The unit cells $UC_1$ and $UC_2$ are defined by the upper separation groove $P_3$.

According to another embodiment of the present invention, the forming of the upper electrode in vacuum and the forming of the upper separation groove $P_3$ by performing laser scribing in atmospheric air can be replaced with a printing of the patterned upper electrode in a non-vacuum environment. For example, the upper electrode patterned by the shape of the second line 420 can be formed in a non-vacuum environment on the photoelectric conversion layer 300 by a printing method such as laser printing, inkjet printing and screen printing and the like. Since the patterned upper electrode is formed in the atmosphere not in vacuum, manufacturing cost can be reduced.

In the manufacturing process described above of the photovoltaic module according to the embodiment of the present invention, while it is described that the lower electrode separation groove $P_1$ is formed along the first line 220 and the upper separation groove $P_3$ is formed along the second line 420, it is also possible that the lower electrode separation groove $P_1$ is formed along the second line 420 and the upper separation groove $P_3$ is formed along the first line 220.

Besides, in FIG. 2 and the manufacturing process described above of the photovoltaic module according to the embodiment of the present invention, while it is described that the width of the lower electrode separation groove $P_1$ is greater than that of the upper separation groove $P_3$, this is just an example. It is also possible that the width of the lower electrode separation groove $P_1$ may be equal to or less than that of the upper separation groove $P_3$.

In the manufacturing process described above of the photovoltaic module according to the embodiment of the present invention, at least one of the lower electrode separation groove $P_1$, the through hole $P_2$ and the upper separation groove $P_3$ can be formed by laser scribing. A laser processing machine (not shown) performing a laser scribing may include a homogenizer such that the intensity distribution of a laser beam oscillated from the laser oscillator are uniformized in a laser beam irradiation area. The homogenizer may be formed through a combination of spherical lenses or formed of an optical fiber cable which utilizes total reflection characteristics.

Figure 5A:
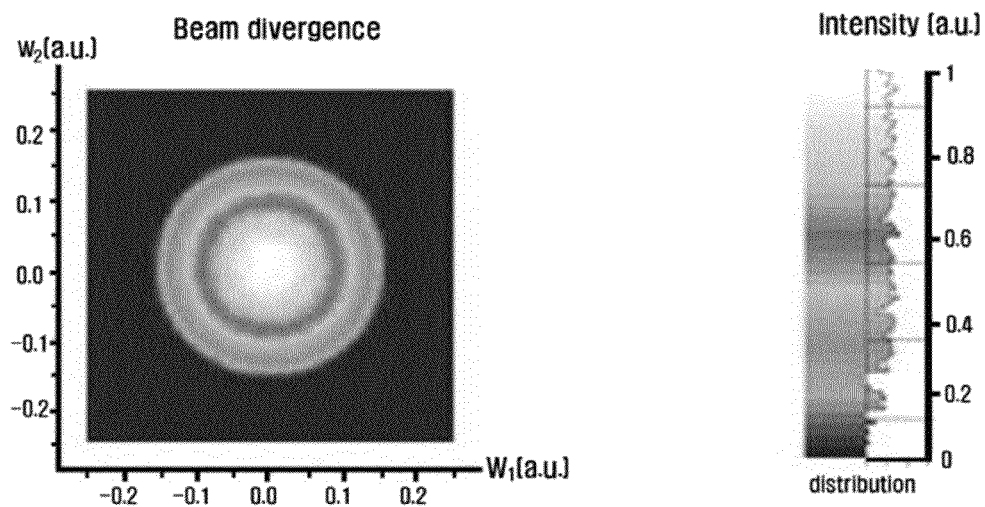
FIGS. 5a and 5b show intensity distributions of a laser beam before and after passing through a homogenizer and show pattern surfaces according to the intensity distributions.
Figure 5B:
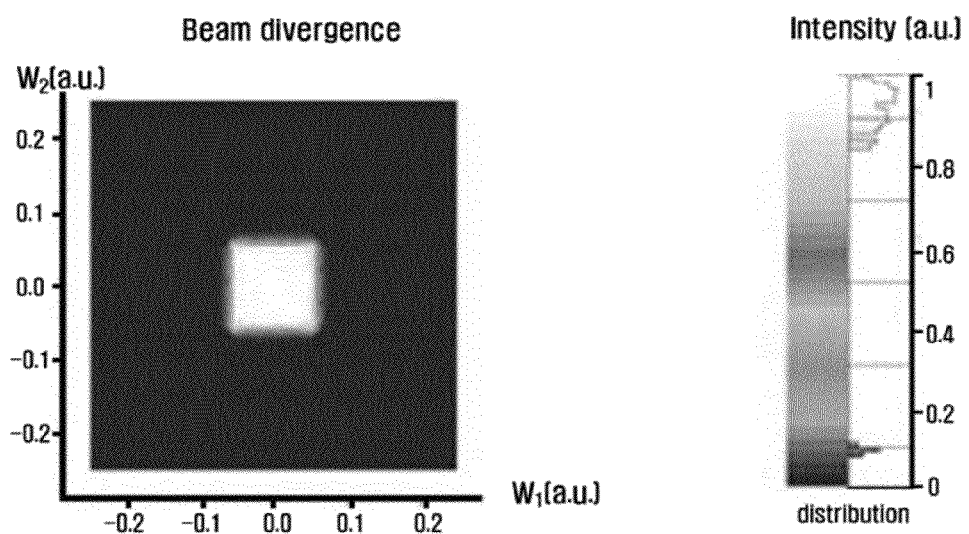

Referring to FIGS. 5a and 5b, when a laser beam which is oscillated from the laser oscillator and has a Gaussian intensity distribution passes through the homogenizer, the laser beam becomes to have a uniform intensity distribution. Additionally, referring to FIGS. 5a and 5b, it can be understood that a pattern surface formed by using the laser beam having a Gaussian intensity distribution (FIG. 5a) is much more irregular than a pattern surface formed by using a laser beam which passes through the homogenizer and has a uniform intensity distribution (FIG. 5b).

In other words, when the intensity distribution of a laser beam becomes uniform, pattern surfaces of the separation grooves formed by irradiating the laser beam is substantially uniformly formed. Accordingly, it is possible to minimize the generation of burr in the side walls of the lower electrode separation groove, the through hole and/or the upper separation groove $P_1$, $P_2$ and $P_3$, so that an integrated thin-film photovoltaic module having improved efficiency can be manufactured. Further, by using the laser beam which has passed through the homogenizer, it is possible to prevent the peripheral photoelectric conversion layer and characteristics of the electrode from being changed by the laser power for desired insulation characteristics.

Additionally, the laser processing machine may include a mask having a predetermined pattern formed therein, which allows the laser beam which has passed through the homogenizer to be selectively transmitted therethrough. As a result, only a laser beam area showing a desired uniform intensity distribution can be used to form the separation groove or the through hole.

Figure 5C:
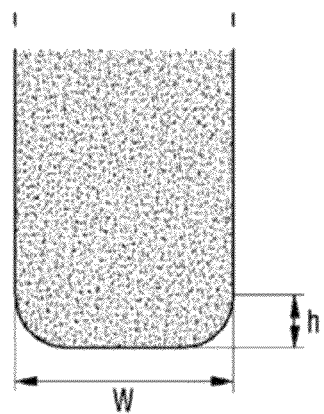
FIG. 5c shows a section of a pattern formed by the laser beam which has passed through the homogenizer.

FIG. 5c shows a section of either the separation groove pattern or the through hole pattern which is formed according to the embodiment of the present invention. Here, it is recommended that a ratio of a level difference "h" of the bottom surface of the pattern to the width "W" of the pattern be equal to or greater than 5% and equal to or less than 10%. When the ratio of the level difference "h" of the bottom surface of the pattern to the width "W" of the pattern is greater than 10%, the edge of the pattern is not sufficiently removed and leak current may be generated. In order that the ratio of the level difference "h" to the width "W" of the pattern may be less than 5%, an excessive laser power is added. As a result, the peripheral photoelectric conversion layer and the characteristics of the electrode may be changed.

In the photovoltaic module including the photovoltaic cells connected in series to each other by the point contact in accordance with the one embodiment of the present invention, it is important that an appropriate number of the through holes $P_2$ be formed. When the number of the through hole $P_2$ is very large, the ineffective area is increased like the straight line type laser scribing, so that electric current cannot sufficiently rise. Moreover, since the upper separation groove $P_3$ formed by the laser scribing is formed to surround the through hole $P_2$, manufacturing time may be increased. When the number of the through holes P2 is very small, a path through which the electron should move to the lower electrode is increased, so that the electrical resistance and Joule heat are increased and then fill factor may be reduced. Therefore, it is necessary to optimize the number of the through holes $P_2$ and the distance between the plurality of the through holes $P_2$ formed between the two adjacent unit cells.

Figure 6:
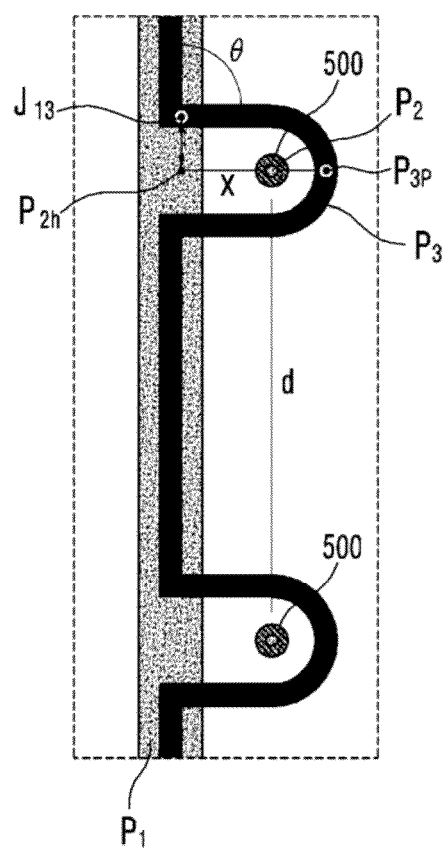
FIG. 6 shows an enlarged view of a dotted-line quadrangular part "A" of FIG. 2.

FIG. 6 shows an enlarged view of a dotted-line quadrangular part "A" of FIG. 2. "d" represents a distance between the two adjacent through holes $P_2$. As shown in FIG. 6, the high resistance layer 500 is formed on the side surface of the through hole P2. "x" represents a distance between the first line 220 and the through hole $P_2$. "$P_{2h}$" represents a foot of perpendicular, which extends from the through hole $P_2$ to the first line 220. "$J_{13}$" represents a branch point from which the lower electrode separation groove $P_1$ and the upper separation groove $P_3$ branch from each other. "r" represents a distance between the $P_{2h}$ and $J_{13}$.

As shown in FIG. 6, the second line 420 is overlapped with the first line 220 with the exception of the areas surrounding the through hole $P_2$. That is, the second line 420 branches off from the point "$J_{13}$" on the first line 220, which is spaced from the foot of perpendicular "$P_{2h}$" at a predetermined distance "r" and surrounds the through hole $P_2$, and then returns to another point on the first line 220, which is spaced from the foot of perpendicular "$P_{2h}$" at the predetermined distance "r".

Here, the second line 420 may be located in the middle between the foot of perpendicular "$P_{2h}$" and the outermost point "$P_{3p}$" from the first line 220. A distance between the second line 420 and the foot of perpendicular "$P_{2h}$" is represented by "2x".

The distance "2x" can be designed, as shown in FIG. 1, as the distance between the lower electrode separation groove $P_1$ and the upper separation groove $P_3$ of the photovoltaic module. In this case, the distance "2x" may be equal to or greater than 200 μm and equal to or less than 300 μm.

In the photovoltaic module according to the embodiment of the present invention, it is recommended that a distance "d" between the through holes $P_2$ be equal to or greater than 1 mm and equal to or less than 5 cm. Here, a ratio of the distance "2x", i.e., the distance between the second line 420 and the foot of perpendicular "$P_{2h}$" to the distance "d" between the through holes $P_2$ may be equal to or greater than $4 \times 10^{-3}$ and equal to or less than $300 \times 10^{-3}$. When the distance "d" is less than 1 mm, the ineffective area is increased, so that electric current cannot sufficiently rise and manufacturing time may be increased. When the distance "d" is greater than 5 cm, a path through which the electron should move to the lower electrode is increased, so that the electrical resistance and Joule heat are increased and then fill factor of the photovoltaic module may be reduced.

The unit cells $UC_1$ and $UC_2$ of the photovoltaic module according to the embodiment of the present invention have a width which is equal to or greater than 6 mm and equal to or less than 15 mm. When the width of the cell is less than 6 mm, the ineffective area is increased and the value of the open circuit voltage (Voc) generated by one module becomes larger, so that installation cost is increased. When the width of the cell is greater than 15 mm, the electrical resistance increases and the efficiency of the manufactured photovoltaic module is degraded.

In the area of the upper separation groove $P_3$, which passes over the lower electrode separation groove $P_1$, that is, the overlapped area of the first line 220 and the second line 420, the ineffective area by the straight line type laser scribing can be ignored. Accordingly, in the integrated thin-film photovoltaic module according to the embodiment of the present invention, the ineffective area by the laser scribing can be regarded as an area where the upper separation groove $P_3$ surrounds the point type through hole $P_2$. In the photovoltaic module according to the embodiment of the present invention, the ineffective area by the laser scribing to the effective area may be equal to greater than 0.007% and equal to or less than 1.5%.

In the photovoltaic module according to the embodiment of the present invention, a shape in which the second line 420 surrounds the through hole $P_2$ can be determined such that an electron path from the through hole $P_2$ to the second line 420 becomes as short as possible. When the electron path from the through hole $P_2$ to the upper separation groove $P_3$ surrounding the through hole $P_2$ is as short as possible, minimum heat can be generated. The shape is formed to have the same distance from the through holes $P_2$, thereby minimizing the ineffective area generated therefrom. For example, the upper separation groove $P_3$ surrounding the through hole $P_2$ may have a partial circular shape. For example, the second line 420 surrounds the through hole $P_2$ in the form of the partial circular shape.

Figure 7A:
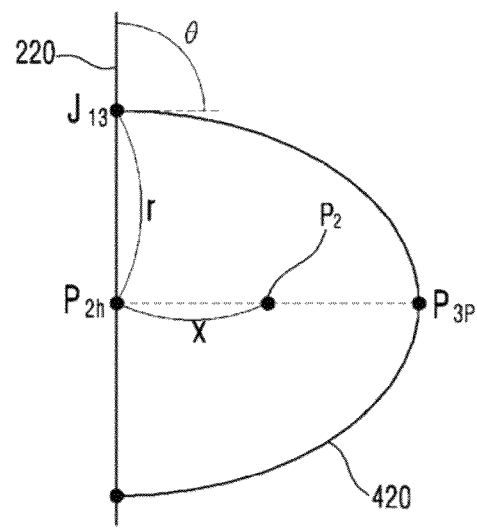
FIGS. 7a to 7c show a shape of a second line surrounding a through-hole according to the embodiment of the present invention.
Figure 7B:
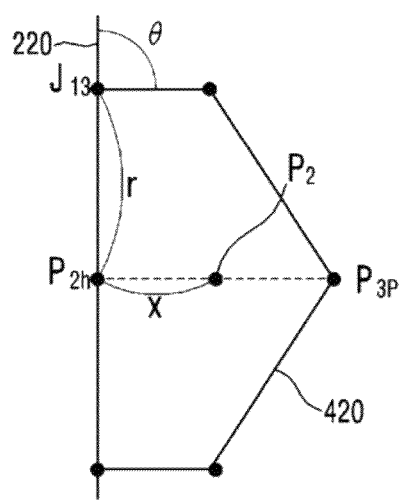
Figure 7C:
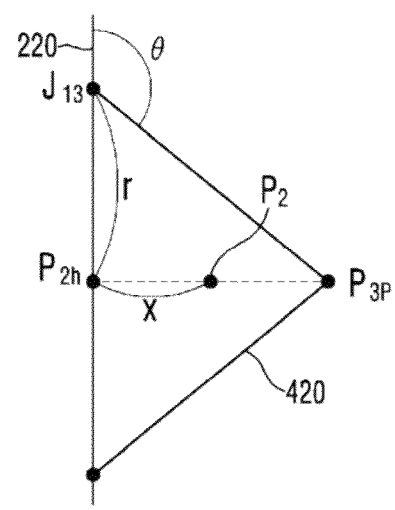

FIGS. 7a to 7c show another example of a shape in which the upper separation groove $P_3$ surrounds the through hole $P_2$ in the photovoltaic module according to the embodiment of the present invention.

FIG. 7a shows that the second line 420 branches off from the branch point "$J_{13}$" on the first line 220 and surrounds the through hole $P_2$ along a partial ellipse. Here, the through hole $P_2$ may be located in the middle between the foot of perpendicular "$P_{2h}$" and the outermost point "$P_{3p}$" of the second line 420. When the second line 420 surrounds the through hole $P_2$ along the partial ellipse or circle, distances from the through hole $P_2$ to the second line 420 are somewhat uniform and the ineffective area can be reduced.

FIGS. 7b and 7c show that the second line 420 surrounds the through hole $P_2$ in a partial pentagon and triangle. It can be noted that also when the second line 420 surrounds the through hole $P_2$ in such shapes, the ineffective area can be reduced and the distances from the through hole $P_2$ to the second line 420 are somewhat uniform.

However, the shapes shown above are just examples. The specific shapes of the photovoltaic module according to the embodiment of the present invention may be a partial polygon including the pentagon or the triangle. Here, only when all of the interior angles of the polygon are less than 180°, the ineffective area can be efficiently reduced. Also, it is recommended that the polygon be symmetrical with respect to a line connecting the foot of perpendicular "$P_{2h}$", the through hole $P_2$ and the outermost point "$P_{3p}$". Also, it is desirable that all of the interior angles of the polygon be equal to or greater than 90°, because when the interior angle of the polygon is an acute angle, the laser beam is focused on the same vertex. As a result, patterning is excessively done or the photoelectric conversion layer and an electrode layer may be damaged by heat.

However, an angle "θ" formed at the branch point "$J_{13}$" by the first line 220 and the second line 420 may be equal to or greater than 90° and equal to or less than 135°. For example, when the shape is a partial circle or ellipse, an angle formed by the first line 220 and a tangent line at the branch point "$J_{13}$" of the circle or the ellipse is equal to or greater than 90° and equal to or less than 135°. When the shape is the partial polygon described above, an external angle of the polygon at the branch point "$J_{13}$" may be equal to or greater than 90° and equal to or less than 135°. When the angle "θ" is less than 90°, the distance between the second line 420 and the through hole $P_2$ are increased and the ineffective area cannot be efficiently reduced. Also, when the angle "θ" is greater than 135°, the width of the second line 420 surrounding the through hole $P_2$ is increased and the effect of reducing the ineffective area is degraded.

Also, a point shape of the through hole $P_2$ may have a circular shape, an elliptical shape or a polygonal shape in accordance with the shape surrounding the through hole $P_2$. The shape of the through hole $P_2$ can be obtained by including a mask having a predetermined pattern formed therein in the laser processing machine such that the laser beam which has passed through the homogenizer can be selectively transmitted. As such, the shape of the through hole $P_2$ is matched to the shape surrounding the through hole $P_2$, thereby reducing and uniformizing the path through which the electron moves from the through hole $P_2$ through the lower electrode to the second line 420 surrounding the through hole $P_2$.

While the embodiment of the present invention has been described with reference to the accompanying drawings, it can be understood by those skilled in the art that the present invention can be embodied in other specific forms without departing from its spirit or essential characteristics. Therefore, the foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A tandem type integrated photovoltaic module comprising:
    a first cell and a second cell, all of which are formed respectively by stacking on a substrate a lower electrode, a photoelectric conversion layer including a plurality of unit cell layers, and an upper electrode,
    wherein the lower electrode of the first cell and the lower electrode of the second cell are separated by a lower electrode separation groove, the lower electrode separation groove extending in a first direction, and
    wherein a plurality of through holes are formed spaced from each other in the first direction and are disposed in the photoelectric conversion layer of the second cell in order to connect the upper electrode of the first cell with the lower electrode of the second cell,
    wherein the photoelectric conversion layer and the upper electrode of the first cell are separated by an upper separation groove from the photoelectric conversion layer and the upper electrode of the second cell, wherein a portion of the upper separation passes over the lower electrode separation groove.

2. The tandem type integrated photovoltaic module of claim 1, wherein further including a high resistance layer formed on a side surface of the through hole.

3. The tandem type integrated photovoltaic module of claim 2, wherein the first cell and the second cell further comprise a transparent electrode layer between the photoelectric conversion layer and the upper electrode, and wherein the through hole is formed in the photoelectric conversion layer and the transparent electrode layer of the second cell.

4. The tandem type integrated photovoltaic module of claim 1, wherein lower electrode separation groove has a straight line shape.

5. The tandem type integrated photovoltaic module of claim 1, wherein the high resistance layer is formed on the side surface of the through hole where a p-n tunnel junction portion of the photoelectric conversion layer is exposed.

6. The tandem type integrated photovoltaic module of claim 4, wherein a ratio of the length of the portion of the upper separation groove passing over the lower electrode separation groove to the length of the lower separation groove is equal to or greater than 0.70 and equal to or less than 0.96.

7. The tandem type integrated photovoltaic module of claim 4, wherein, in another portion where the upper separation groove does not pass over the lower electrode separation groove, the upper separation groove has a partial circular shape or a partial elliptical shape.

8. The tandem type integrated photovoltaic module of claim 7, wherein, at a branch point from which the upper separation groove having the partial circular shape or partial elliptical shape branches off the straight line shape, an angle formed by the straight line shape and a tangent line of the circular shape or the elliptical shape is equal to or greater than 90° and equal to or less than 135°.

9. The tandem type integrated photovoltaic module of claim 4, wherein, in another portion where the upper separation groove does not pass over the lower electrode separation groove, the the upper separation groove has a partial polygonal shape.

10. The tandem type integrated photovoltaic module of claim 9, wherein, at a branch point from which the upper separation groove having the partial polygonal shape branches off the straight line, an external angle of the partial polygonal shape is equal to or greater than 90° and equal to or less than 135°, and wherein all of the interior angles of the partial polygonal shape are less than 180°.

11. The tandem type integrated photovoltaic module of claim 4, wherein, in another portion where the upper separation groove does not pass over the lower electrode separation groove, the through hole is located in the middle between a foot of perpendicular which extends from the through hole to the straight line shape and the outermost point of the upper separation groove within the another portion where the upper separation groove does not pass over the lower separation groove.

12. The tandem type integrated photovoltaic module of claim 1, wherein the widths of the first cell and the second cell are equal to or greater than 6 mm and equal to or less than 15 mm respectively.

13. The tandem type integrated photovoltaic module of claim 1, wherein a distance between two adjacent through holes among the through holes is equal to or greater than 1 mm and equal to or less than 5 cm.

14. The tandem type integrated photovoltaic module of claim 1, wherein, in the tandem type integrated photovoltaic module, a ratio of an ineffective area by the lower electrode separation groove, the through hole and the upper separation groove to an effective area is equal to or greater than 0.007% and equal to or less than 1.5%.

15. The tandem type integrated photovoltaic module of claim 4, wherein two adjacent through holes among the through holes are spaced from each other, and wherein a ratio of a distance between the foot of perpendicular which extends from the through hole to the straight line shape and the outermost point of the upper separation groove within the another portion where the upper separation groove does not pass over the lower separation groove to the predetermined distance is equal to or greater than $4\times10^{-3}$ and equal to or less than $300\times10^{-3}$.

16. The tandem type integrated photovoltaic module of claim 1, wherein a cross-section of the through hole has a circular shape, an elliptical shape or a polygonal shape.

17. The tandem type integrated photovoltaic module of claim 1, wherein, in at least one of the lower electrode separation groove, the through hole and the upper separation groove, a ratio of level difference of the bottom surface to the width is equal to or greater than 5% and equal to or less than 10%.

18. The tandem type integrated photovoltaic module of claim 1, wherein the photoelectric conversion layer further comprises at least one intermediate reflector between the unit cell layers, and wherein the high resistance layer is formed on the side surface of the through hole where the intermediate reflector is exposed.

* * * * *